(12) United States Patent
Thus

(10) Patent No.: US 6,326,906 B1
(45) Date of Patent: Dec. 4, 2001

(54) KEYBOARD AND DEVICE PROVIDED WITH THE KEYBOARD

(75) Inventor: Franciscus J. M. Thus, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 08/966,223

(22) Filed: Nov. 7, 1997

(30) Foreign Application Priority Data

Nov. 13, 1996 (EP) .................................................. 96203171

(51) Int. Cl.[7] ...................................................... H03K 17/94
(52) U.S. Cl. ............................. 341/26; 341/22; 345/169; 379/368; 455/575
(58) Field of Search ........................ 341/22, 26; 379/368, 379/369, 370; 345/169, 172; 708/144, 145; 455/550, 575

(56) References Cited

U.S. PATENT DOCUMENTS

| | | | |
|---|---|---|---|
| 4,585,908 | * | 4/1986 | Smith .................................... 179/81 C |
| 5,790,054 | * | 8/1998 | Hsu et al. ................................ 341/22 |
| 5,987,336 | * | 11/1999 | Sudo et al. ............................ 455/575 |

FOREIGN PATENT DOCUMENTS

0427011A2    5/1991   (EP) ............................... H03M/1/00

* cited by examiner

*Primary Examiner*—Timothy Edward, Jr.

(57) ABSTRACT

A keyboard has key positions providable with keys. A number of the key positions are actually provided with keys, whereas at least one other key position has a mode setting option. The mode setting option provides a feature that is readable by a microprocessor connected to the keyboard. Such features include pulse dialing parameters such as a pulse rate, a pulse width, and a pulse pause, or tone dialing parameters, or the like.

10 Claims, 2 Drawing Sheets

KEYBOARD AND DEVICE PROVIDED WITH THE KEYBOARD

BACKGROUND OF THE INVENTION

The present invention relates to a keyboard having key positions providable with keys.

The present invention further relates to a device provided with such a keyboard.

Such a keyboard and device are known from EP-A-427011. The known keyboard has key positions provided between conducting row and column lines of the keyboard matrix. At each intersection between a row and a column line, either a switch or a diode is connected there between. The known device comprises a keyboard connected to a microprocessor, which microprocessor in turn is equipped for controlling the row lines such that they function either as a sender or as a receiver of line signal in order to read out which of the switches on the keyboard is pressed. All diodes are necessary to conduct a signal from one row line to one column line or vice versa in order to perform this key read out or key scan function. Its a disadvantage of the known keyboard and device that they do not present sufficient flexibility with respect to the arrangement, embodiment and the assignment of additional functions thereto, because each and every intersection between a row and a column line is occupied by either said switch or said diode. This leads to an unwanted rigidity of the applicability of the known keyboards in practise.

OBJECTS AND SUMMARY OF THE INVENTION

It is an object of the present invention to provide for a keyboard and a device having such a keyboard showing more flexibility in applying different kinds of keyboards by introducing the possibility of assigning adjustable and selectable functionalities to each individual keyboard.

To this end the present invention is characterised in that at least one of the key positions is provided with keys, and that at least one of the key positions which is not provided with a key has a mode setting option implemented there on. The basic idea underlying the invention is that positions on a keyboard which are not occupied by keys can be interchanged with mode setting options and can be used to implement these options. In general the ratio wherein the not occupied keys can be interchanged with a mode setting option depends on the kind of keyboard that is being used. Mode setting options serve the purpose of adding functional feature information to the microprocessor, such as information about pulse or tone dialling/parameters, the pulse rate, the pulse time, pulse width, pulse pause ratio, type of ring melody, timing information, and other kinds of information which may or may not differ per country. In practise mode setting options are being set and read out or scanned by software running in the microprocessor at the start of a working session. Furthermore it is an advantage of the present invention that the pin count on the integrated circuit of the microprocessor is not increased by the solution presented.

In an embodiment of the keyboard according to the invention the keyboard is a matrix type keyboard or a triangle type keyboard. It is an advantage of the embodiment of the present invention that the practically important conventional and triangle keyboard types can benefit from mode setting options without IC pin count increase or negative influence on the complexity of key scan routines or mode setting scan routines.

BRIEF DESCRIPTION OF THE DRAWINGS

At present the invention will be elucidated further together with the additional advantages with reference to the accompanying drawing, whereby corresponding parts in the different figures of the drawing are indicated by means of the same reference numerals. In the drawing.

DETAILED DESCRIPTION OF THE PREFERRED EMBODIMENT

Figure 1:
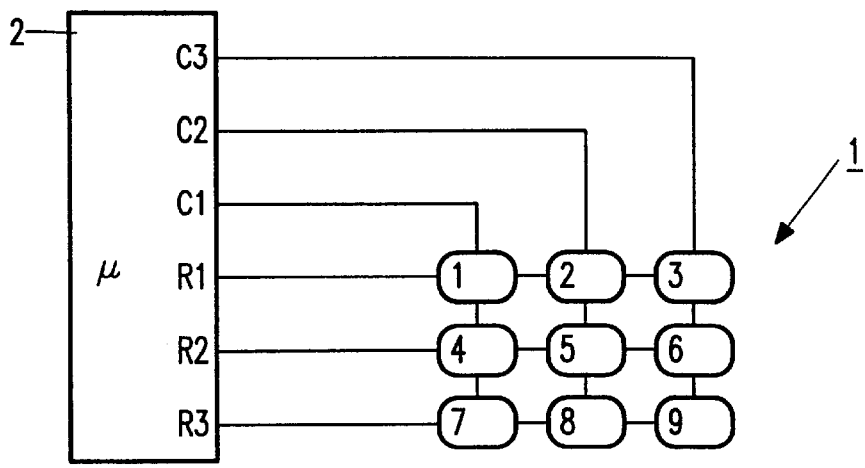
FIG. 1 shows a conventional matrix keyboard.

FIG. 1 shows a matrix keyboard 1 which is connected to row lines R1 . . . R3 and column lines C1 . . . C3 of a schematically represented Integrated Circuit (IC) 2. The row lines R1 . . . R3, and the column lines C1 . . . C3 are connected to generally Input/Output (I/O) ports of the IC. The keyboard 1 is provided with keys in the form of switches, wherein ciphers 1 . . . 9 are indicated in oval symbols. In the Integrated Circuit 2 a read out or scan procedure is implemented by means of suitable software capable of at least identifying which of the keys is actuated.

At first a possible scanning procedure to identify the actuated key will now be elucidated by way of example with respect to this embodiment. Suppose lines C1 . . . C3 serve as input and have an internal pull-up, meaning that they are on a high logic level, while lines R1 . . . R3 serve as output and are at a low logic level. Scanning can be started after detection of a transition at input column lines C1 . . . C3 using an OR-function. This provides for the possibility of creating a keyboard interrupt for the processor in the IC 2. Output lines R1 . . . R3 are being scanned as follows in order to detect the actuated key: p1 R1 is low, R2 and R3 are high, thus pressing one of the keys (1), (2) or (3) can be detected;

R2 is low, R1 and R3 are high, thus pressing one of the keys (4), (5) or (6) can be detected; and R3 is low, R1 and R2 are high, thus pressing one of the keys (7), (8) or (9) can be detected.

After releasing the pressed key and detecting that no key is being pressed, output lines R1 . . . R3 become low again, ready to detect a next transition at the pressing of a key. In this particular case C1 . . . C3 are inputs, and they are not being scanned.

Figure 2:
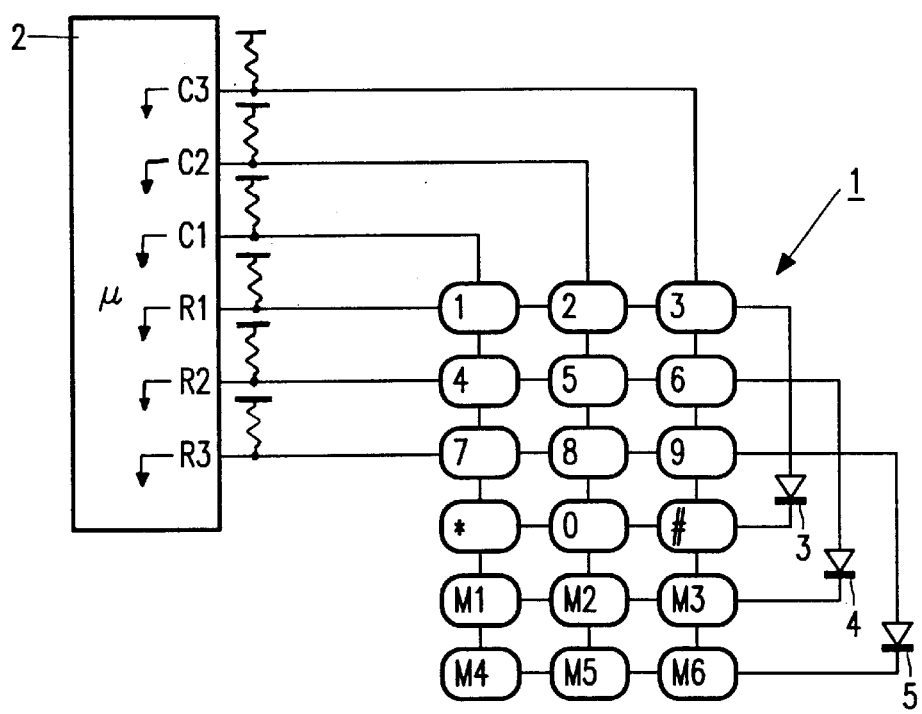
FIG. 2 shows the keyboard of FIG. 1 having key number extending diodes.

FIG. 2 shows the conventional keyboard 1 provided with additional diodes 3 . . . 5, which serve the purpose of extending, in this case doubling, the number of detectable keys while the same number of lines R1 . . . R3 and C1 . . . C3 are being used. Now scanning will take place continuously and can be implemented as follows:

Clear (=set low) C1, lines R1 . . . R3 and C2 . . . C3 serve as inputs being set logic high by a pull-up mentioned earlier.

Scan R1. If R1 is high, this means keys (1) and (*) are not being pressed;

Scan R2. If R2 is also high, this means keys (4) and (M1) are not being pressed;

Scan R3. Suppose R3 is logic low, then either key (7), or key (M4) is being pressed;

Now that in this example R3 is low, R3 is cleared now (as output) and C1 is scanned (now as input). If C1 is low key (7) is being pressed, else, C1 remains high, and key (M4) is being pressed;

Thereafter C1 becomes an input again, C2 is cleared and the procedure is repeated, as described above;

This continues procedure is repeated for all lines, whereafter the procedure starts again.

Figure 3:
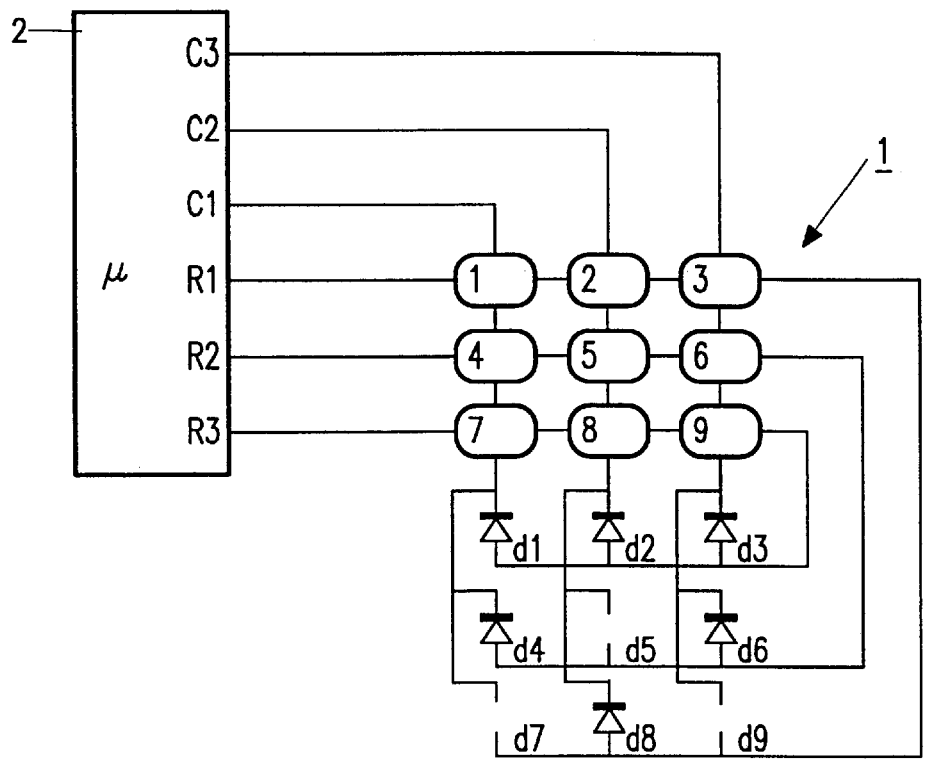
FIG. 3 shows a possible embodiment according to the invention of a conventional type matrix keyboard provided with mode setting options in the form of diode options.

FIG. 3 shows an possible embodiment, wherein some of the possible key positions are exchanged by mode setting options, here embodied as diode options, i.e., some of the key positions are keyless. The diode options are implemented by the presence or absence of diodes d1 . . . d9. Note that no extra diode pin connection to the IC 2 is needed. Scanning of the diode options takes place in an initial phase without any key action. The rather simple diode option scanning is being done by applying a logic low signal to respective ones of the C1 . . . C3, while R1 . . . R3 are at a logic high level. Repetitive scanning of R1 . . . R3 reveals information about which of the diodes is present and which is not, thus providing the wanted mode setting information to the microprocessor in IC 2.

So far matrix keyboards 1 are described having mode setting options, which are substituted in a one to one relation by a possible keyboard key. The exemplified 6 I/O IC pins provide a maximum amount of detectable keys of 9, which doubles with the presence of the key number extending diodes 3–5. 12 I/O IC pins give rise to such a maximum of 36, which also doubles if key number extending diodes are used. All kinds of keyboard arrangements can benefit from mode setting options. The important class of triangle matrix keyboard, which will now be described further in relation to those options and the scanning thereof, provide a maximum amount of 66 with 12 I/O IC pins, whereas the application of key number extending diodes alone leads to such a maximum of 198, which is equal to three times that maximum amount.

Figure 4:
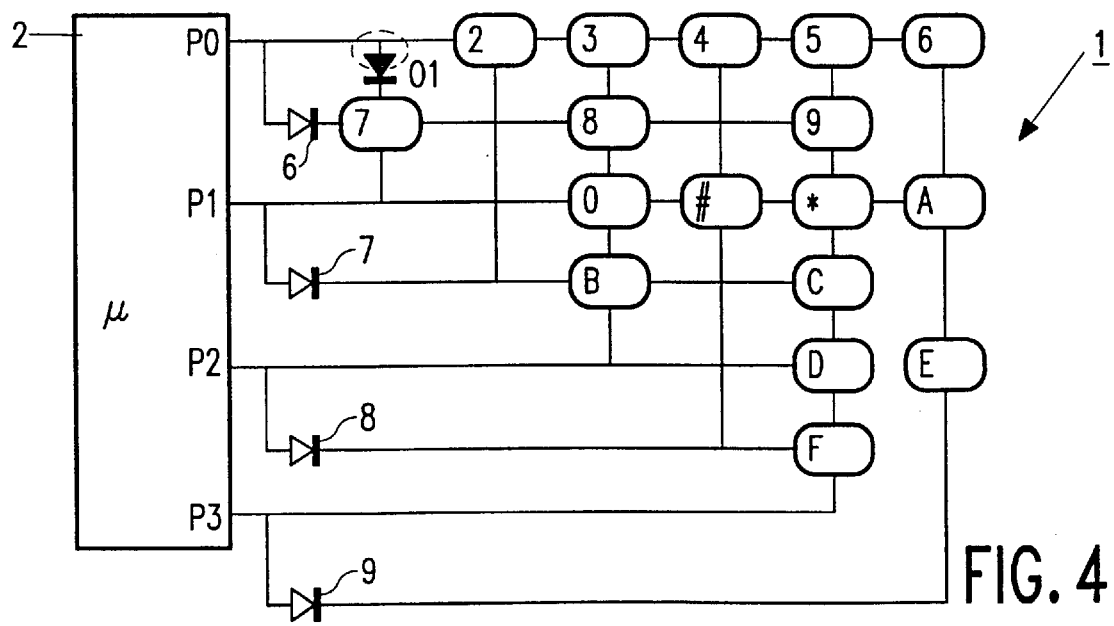
FIG. 4 shows another possible embodiment according to the invention of a triangle type keyboard provided with mode setting options in the form of diode options.

FIG. 4 shows IC 2 connected via ports P1 . . . P3 to a triangle type keyboard 1 in this particular embodiment provided with additional key number extending diodes 6 . . . 9, and for simplicity of the description only one mode setting option diode O1. The continues scanning for detection of a particular key which is being pressed will not be described here further as there exist several ways to apply the scanning, which speak for themselves and are not a further topic. Scanning for the possible mode setting diodes in a triangle type keyboard according to FIG. 4 could be tried to be carried out along the following lines:

If during scanning P1 is low P0 is logic low, due to O1; P0 is also low if key (7) is being pressed;

In case the polarity is reversed P0 will not influence P1. The conclusion is no unambiguous decision can be reached about either the pressing of key (7) or the presence of mode setting option diode O1. So in this example key (7) can not be used in conjunction with diode O1, unless no key action exists during this initial scanning. The implementation of a mode setting option in a triangle type keyboard having key number extending diodes therefore costs two key positions, also in case the polarity of O1 is reversed. However in view of the aforementioned triplication of maximum detectable keys for such keyboards, there will always be sufficient key positions left over, which will not be used for keys and which can now advantageously be used as mode setting options. The degree of advancement of the software needed to scan the mode setting options generally depends on whether or not the software is supposed to be familiar with those key positions where it can expect to find mode setting options instead. The mode settings, which are detected during the scanning are processed by the software and stored in a memory # of the microprocessor for taking the measures deemed necessary in relation to the outcome of the mode setting scanning procedure. Examples of these measures are the actual setting of for example pulse or tone dialling/parameters, the pulse rate, the pulse time, pulse width, pulse pause ratio, type of ring melody, timing parameters etcetera. The present disclosure is not limited to mode setting options implemented by means of one way conducting means, in general semiconductor means, such as diodes. Principally resistor means are applicable as mode setting means as well. However in that case the current sinking and/or the current sourcing capabilities of the IC I/O ports P1 . . . P3, and the resistor means value are an issue, which can easily be dealt with by the man skilled in the microprocessor and keyboard art.

Figure 5:
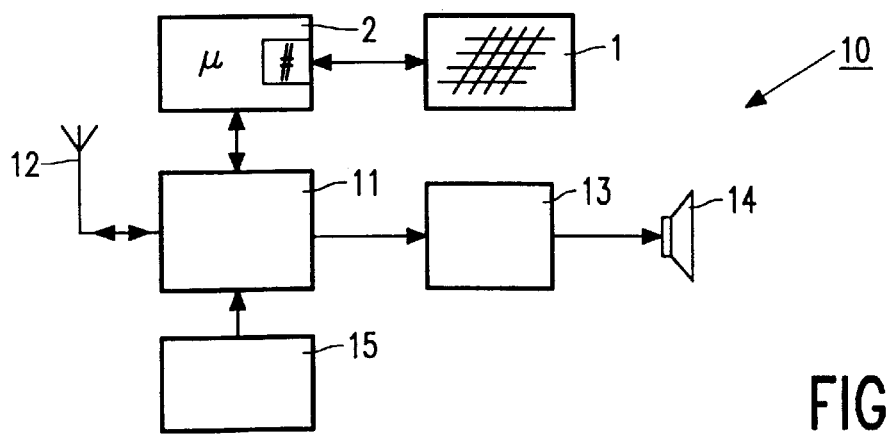
FIG. 5 shows a schematic view of a device according to the invention provided with a keyboard of FIGS. 4 or 5.

FIG. 5 shows a schematically depicted device 10 provided with at least a keyboard 1, which is connected to the IC 2. The device 10 further comprises a transceiver 11 coupled to an antennae 12, an audio assembly 13 including a loudspeaker 14 connected to the transceiver 11, and a power unit 15, generally connected to each of the device components 1, 2, 11, and 13. The device 10 could be an electronic device, for example a computer device, a controller device such as a remote control for audio, video, CD etcetera, or a telecommunication device, such as a fixed (without antennae 12), cellular or cordless telephone device. The device could also be included in some kind of network, such as for example a Local Area Network (LAN), or a Wide Area Network (WAN).

What is claimed is:

1. A keyboard comprising:
    a plurality of detectable key positions,
        at least one key position of the plurality of key positions being provided with a key, and
        at least another key position of the plurality of key positions being a keyless position that is configured to optionally receive a conducting element, wherein the keyless position facilitates a determination of a functional mode of the keyboard based on whether the conducting element is located in the keyless position.

2. A keyboard according to claim 1, wherein the keyboard is a matrix type keyboard.

3. A keyboard according to claim 1, wherein the keyboard is provided with additional, key number extending, diodes.

4. A keyboard according to claim 1, wherein the conducting element comprises a resistor.

5. A keyboard according to claim 1, wherein the keyboard is a triangle type keyboard.

6. A keyboard according to claim 1, wherein the conducting element comprises a unidirectional conductor.

7. A keyboard according to claim 6, wherein the unidirectional conductor is a semiconductor device.

8. A keyboard according to claim 7, wherein the semiconductor device comprises as least a diode.

9. An electronic device comprising:
    a keyboard with a plurality of detectable key positions,
        at least one key position of the plurality of key positions being provided with a key, and
        at least another key position of the plurality of key positions being a keyless position that is configured to optionally receive a conducting element, wherein the keyless position facilitates a determination of a functional mode of the keyboard based on whether the conducting element is located in the keyless position.

10. An electronic device according to claim 9, the electronic device further comprising a microprocessor that is coupled to the keyboard, the microprocessor being configured to scan the at least one keyless position to detect the conducting element.

* * * * *